United States Patent
Dong et al.

(10) Patent No.: US 9,627,272 B2
(45) Date of Patent: Apr. 18, 2017

(54) PATTERNING SCHEME TO MINIMIZE DRY/WETS STRIP INDUCED DEVICE DEGRADATION

(71) Applicant: GLOBALFOUNDRIES Inc., George Town (KY)

(72) Inventors: Huihang Dong, Ridgefield, CT (US); Wai-Kin Li, Hopewell Junction, NY (US)

(73) Assignee: GLOBALFOUNDRIES INC., George Town (KY)

( * ) Notice: Subject to any disclaimer, the term of this patent is extended or adjusted under 35 U.S.C. 154(b) by 0 days.

(21) Appl. No.: 14/833,813

(22) Filed: Aug. 24, 2015

(65) Prior Publication Data
US 2017/0062281 A1 Mar. 2, 2017

(51) Int. Cl.
| H01L 21/3205 | (2006.01) |
| --- | --- |
| H01L 21/8238 | (2006.01) |
| H01L 21/3213 | (2006.01) |
| H01L 21/28 | (2006.01) |
| H01L 21/02 | (2006.01) |

(52) U.S. Cl.
CPC ........... *H01L 21/823842* (2013.01); *H01L 21/02118* (2013.01); *H01L 21/28088* (2013.01); *H01L 21/32139* (2013.01)

(58) Field of Classification Search
CPC ......... H01L 21/28088; H01L 21/28123; H01L 21/32139; H01L 29/4966
See application file for complete search history.

(56) References Cited

U.S. PATENT DOCUMENTS

| 7,084,024 | B2 | 8/2006 | Gluschenkov et al. |
| 8,367,556 | B1 | 2/2013 | Fuller et al. |
| 8,586,440 | B2 | 11/2013 | Flachowsky et al. |
| 8,791,001 | B2 | 7/2014 | Lin et al. |
| 2009/0294920 | A1 | 12/2009 | Chudzik et al. |
| 2010/0075478 | A1 | 3/2010 | Chang |

(Continued)

OTHER PUBLICATIONS

Govindarajan et al., "Effect of Pretreatment of High-Dose Implanted Resists by Activated Hydrogen Peroxide Chemical Systems for Their Effective Removal by Conventional Sulfuric—Peroxide Mixtures", IEEE Transactions on Semiconductor Manufacturing, 25(3), pp. 523-530 (2012).

(Continued)

*Primary Examiner* — Trung Q Dang
*Assistant Examiner* — Frederick B Hargrove
(74) *Attorney, Agent, or Firm* — Yuanmin Cai; Andrew M. Calderon; Roberts Mlotkowski Safran Cole & Calderon, P.C.

(57) ABSTRACT

A patterning scheme to minimize dry/wet strip induced device degradation and resultant devices are provided. The method includes removing a workfunction material over a first device area of a structure, while protecting the workfunction material over a second device area of the structure with a first masking material. The method further includes applying a second masking material over the first device area and the first masking material. The method further includes removing the first masking material and the second masking material until the workfunction material is exposed over the second device area.

19 Claims, 2 Drawing Sheets

(56) References Cited

U.S. PATENT DOCUMENTS

| | | | |
|---|---|---|---|
| 2010/0124818 A1* | 5/2010 | Lee | H01L 21/823807 |
| | | | 438/589 |
| 2012/0319214 A1* | 12/2012 | Ma | H01L 21/823842 |
| | | | 257/410 |
| 2014/0076353 A1 | 3/2014 | Berry et al. | |
| 2014/0191366 A1 | 7/2014 | Brodsky et al. | |
| 2015/0035016 A1 | 2/2015 | Ganz | |
| 2015/0380251 A1* | 12/2015 | Glodde | H01L 21/28123 |
| | | | 438/591 |

OTHER PUBLICATIONS

Tsvetanova et al., "Removal of High-Dose Ion-Implanted 248 nm Deep UV Photoresist Using UV Irradiation and Organic Solvent", Journal of the Electrochemical Society, 158(2), pp. H150-H155 (2011).

Malhouitre et al., "Stripping of Ion Implanted Photoresist by CO2 Cryogenic Pre-treatment Followed by Wet Cleaning", Solid State Phenomena, 145, pp. 289-292 (2009).

Wada et al., "All Wet Photoresist Strip by Solvent Aerosol Spray", Solid State Phenomena, 145, pp. 285-288 (2009).

* cited by examiner

PATTERNING SCHEME TO MINIMIZE DRY/WETS STRIP INDUCED DEVICE DEGRADATION

FIELD OF THE INVENTION

The disclosure relates to semiconductor structures and, more particularly, to a patterning scheme to minimize dry/wet strip induced device degradation and resultant devices.

BACKGROUND

The application of high dose implant (to change resistance of an NFET or PFET) and high-k/metal gate stacks pose challenges to the existing processes of record for strip technologies, particularly for three dimensional (3D) finFet technologies with high aspect ratios. For example, current ashing processes have some epitaxial, high-k dielectric and workfunction metal damage concern.

More specifically, resist strip is required to minimize substrate surface oxidation/damage, and prevent the loss, redistribution and deactivation of implanted species in epi-Ge, high-k gate dielectric, workfunction metal and interlevel dielectric layers. Conventional methods of resist strip include plasma ashing approaches, which have limits that inhibit their ability to meet advanced strip requirements. For example, fluorine-containing chemistries are very effective for crust breakthrough and residue removal, but are known to produce substrate damage and dopant bleaching. On the other hand, oxidizing chemistries (e.g., $O_2$/FG) are known to cause high substrate oxidation. Also, although forming gas (e.g., 96% $N_2$+4% $H_2$) by itself (without added oxygen) can achieve low substrate oxidation, these chemistries have been shown to cause issues with epitaxial erosion and TiN interaction with workfunction metals, high-dielectric materials and interlevel dielectric layers.

Another challenge includes unbalanced strip time (OE) when comparing open FET vs. non-open FET technologies. For example, ashing or stripping of optical planarization layers (OPL) or other polymer layers on a protected side of the device, e.g., PFET, can result in an added strip time. This added strip time results in the unwanted stripping or erosion of workfunction metals and high-dielectric materials. That is, such stripping or ashing processes causes high-k dielectric and workfunction metal damage due to the unbalanced strip time needed to remove remaining OPL on non-open area. This damage can contribute to especially large isolated device leakage (EG or eDRAM).

SUMMARY

In an aspect of the disclosure, a method includes: removing a workfunction material over a first device area of a structure, while protecting the workfunction material over a second device area of the structure with a first masking material; applying a second masking material over the first device area and the first masking material; and removing the first masking material and the second masking material until the workfunction material is exposed over the second device area.

In an aspect of the disclosure, a method includes: forming a workfunction metal on a first device area and a second device area; forming a masking material over the first device area; removing the workfunction material over the second device area, while the workfunction material over first device area is protected with the masking material; applying a second masking material over the second device area and over the first masking material, the first masking material and the second masking material having a same or substantially the same removal rate; and removing the first masking material and the second masking material until the workfunction material is exposed over the first device area, wherein the second masking material balances strip time of the first device area and the second device area.

In an aspect of the disclosure, a method includes: forming a workfunction metal over a high-k dielectric material in an NFET device area and a PFET device area; forming an optical planarization layer (OPL) over the NFET device area; removing the workfunction material to expose the high-k dielectric material in the NFET device area, while the workfunction material over PFET device area remains protected; applying a second layer of OPL over the NFET device area including within a trench having a lining of the high-k dielectric material and over the OPL; and removing the OPL and second OPL until the workfunction material is exposed over the PFET device area.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The disclosure relates to semiconductor structures and, more particularly, to a patterning scheme to minimize dry/wet strip induced device degradation and resultant devices. More specifically, the present disclosure is directed to a patterning scheme which applies a second polymer (or resist) layer on at least an open area of a structure in order to balance strip time of wet and dry etches between open and protected areas (e.g., NFET and PFET sides of the structure). Advantageously, by implementing the patterning scheme of the present disclosure, the ashing time on an exposed device, e.g., NFET or PFET, can balanced and minimized thus reducing any device impact, e.g., pEG Vbd, etc., due to over-etching of the workfunction metal and/or high-k dielectric material of the initially protected device.

In embodiments, the method of manufacture can also be used in other key semiconductor device fabrication processes such as post epi (e.g., Si—Ge) implant strip, post spacer etch (exposing Si Fin) where exposed device area is super sensitive to dry/wets resist strip. For example, by applying a second resist (e.g., OPL) before ashing/wets, the ash damage to the device area (especially the open area) could be balanced and minimized to achieve the least substrate loss, thus improve device performance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures of the present disclosure are built on wafers and are realized in films of material patterned by photolithographic processes on the top of a wafer. In particular, the fabrication of the structures of the present disclosure uses three basic building blocks: (i) deposition of thin films of material on a substrate, (ii) applying a patterned mask on top of the films by photolithographic imaging, and (iii) etching the films selectively to the mask.

Figure 1:
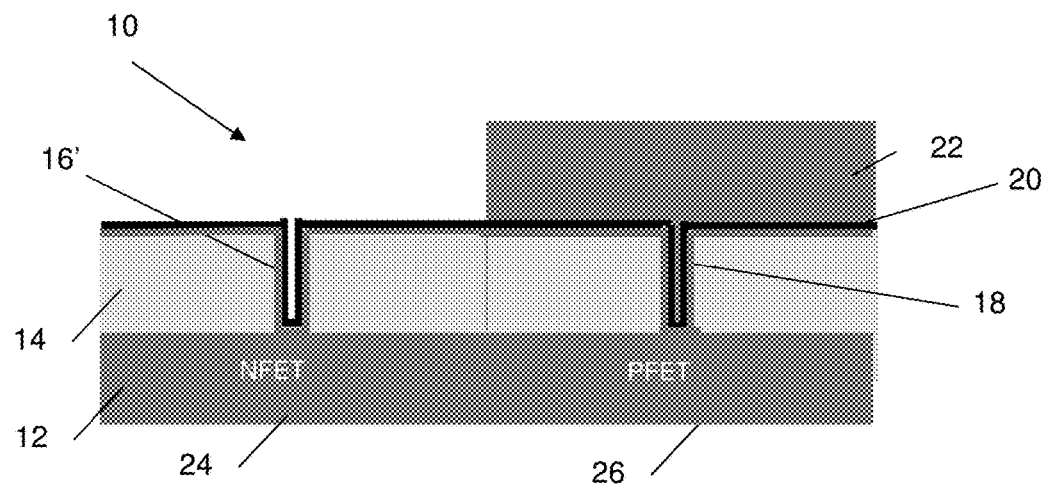
FIG. 1 shows a cross-sectional view of a structure and respective fabrication processes according to aspects of the present disclosure.

FIG. 1 shows a cross-sectional view of a structure and respective fabrication processes according to aspects of the present disclosure. In embodiments, the structure 10 is a three dimensional device, e.g., having a plurality of fins 12 composed of semiconductor material. For example, the semiconductor material may be, but not limited to, Si, SiGe, SiGeC, SiC, Ge alloys, GaAs, InAs, InP, or other semiconductor compounds. Although the illustrative example includes finFET technologies, the techniques described herein can also be applicable for planar devices.

In embodiments, the fins 12 can be fabricated using conventional sidewall image techniques. For example, a mandrel material, e.g., SiO$_2$, is formed on the semiconductor material, using conventional deposition (e.g., chemical vapor deposition (CVD), lithography and etching processes. A resist is formed on the mandrel material, and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 12, for example. The mandrels are removed or stripped using a conventional etching process, selective to the mandrel material. An etching is then performed within the spacing of the spacers to form the sub-lithographic features, e.g., fins 12. The sidewall spacers can then be stripped.

Still referring to FIG. 1, an interlevel dielectric material 14 is formed over the fins 12 (or semiconductor material) using conventional deposition methods, e.g., CVD. The interlevel dielectric material 14 can be an oxide based material, e.g., SiO$_2$. Trenches 16 are formed in the interlevel dielectric material 14 using conventional lithography and etching processes. For example, a resist is formed over the interlevel dielectric material 14, which is patterned by exposure to energy (e.g., light). The trenches 16 are then formed through the patterns (openings). The resist can then be removed by a conventional oxygen ashing process or other known stripping processes.

The trenches 16 are filled by deposition of dielectric material 18 and workfunction metals 20. In embodiments, the dielectric material 18 can be a high-k dielectric material such as a hafnium based material. The workfunction metal 20 can be any workfunction metal appropriate for a particular device, e.g., an PFET device 26.

An optical planarization layer (OPL) of polymer material (or resist) 22 is formed on one side of the structure, e.g., PFET device 26, while the other side of the structure, e.g., NFET 24, is exposed for further processing (e.g., removal of the workfunction metal 20). For example, an OPL is deposited and baked on the structure, followed by deposition of a hardmask, e.g., SiO$_2$, nitride, etc. The hardmask undergoes a conventional lithography and etching processes to expose the OPL 22 over the NFET device 24. The exposed portion of the OPL over the NFET device 24 is then removed using a conventional etching process to expose the workfunction metal 20 (over the NFET device 24). The hardmask is removed using conventional stripants. It should be understood by those of skill in the art that this process can also be used to expose the workfunction metal 20 on the PFET device 26, while protecting the workfunction metal 20 on the NFET device 24.

Figure 2:
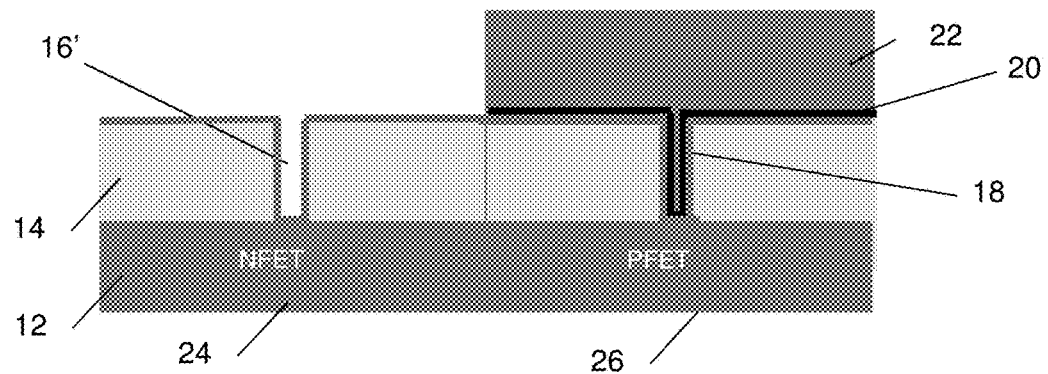
FIG. 2 show removal of a workfunction metal on a portion of the structure, e.g., over an NFET device, and resultant structure according to aspects of the present disclosure.

As shown in FIG. 2, the exposed workfunction metal 20, e.g., over the NFET device 24, is removed by a conventional etching process. For example, the workfunction metal 20, e.g., TiN, can be removed by a wet etch process which is reactive to the TiN. The removal of the workfunction metal 20 will form a trench 16', exposing the underlying high-k dielectric material 18 of the NFET device 24. During these fabrication processing steps, the high-k dielectric material 18 and the workfunction metal 20 over the PFET device 26 will remain protected. In this way, the PFET device 26 will remain protected.

Figure 3:
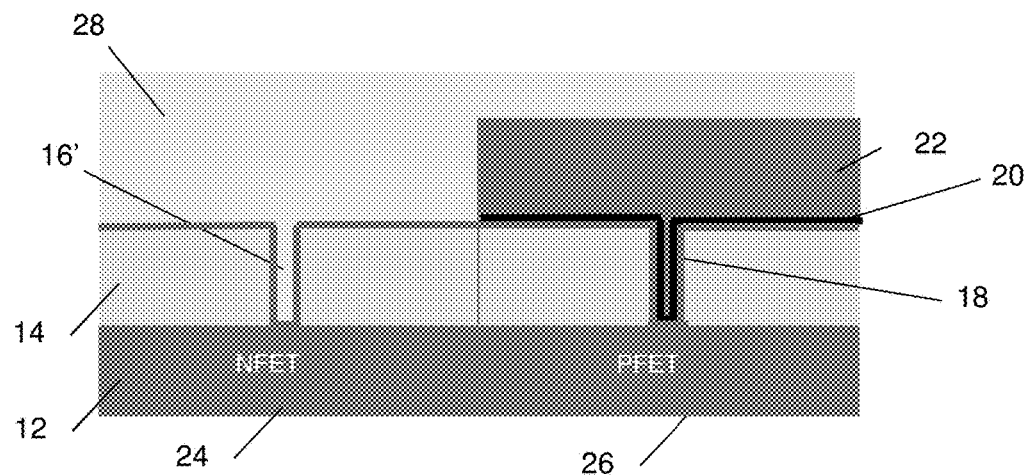
FIG. 3 show an application of a second spin on material or resist over the structure, e.g., over an NFET device and PFET device, and resultant structure according to aspects of the present disclosure.

In FIG. 3, an optical planarization layer (OPL) or resist material 28 will be formed over the structure. More specifically, the OPL or resist material 28 is formed within the trench 16' and on any exposed high-k dielectric material 18 (over the NFET device 24), as well as on the OPL or resist material 22 on the PFET device 26. The OPL can be applied by a spin on process; whereas the resist material can be deposited using conventional deposition processes, e.g., CVD. The OPL or resist material 28 should preferably have the same or substantially the same etch rate as the OPL or resist material 22. This second layer 28, e.g., OPL or resist material, will have good planarization and filling capability and will balance the strip time (dry or wet etches) between the open area (e.g., NFET device 24) and the protected area (e.g., PFET device 26). Also, by selecting different spin on materials (e.g., different C %), the open area can be further protected, if desired.

Figure 4:
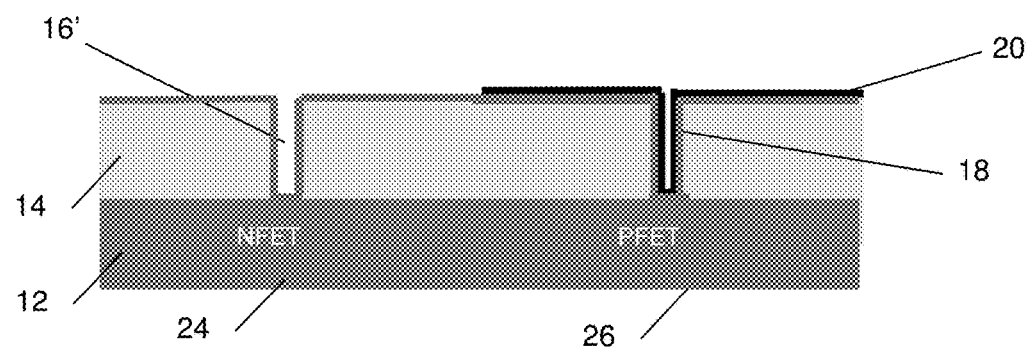
FIG. 4 show removal of spin on materials and/or resist materials over the structure, e.g., over an NFET device and PFET device, and resultant structure according to aspects of the present disclosure.

In FIG. 4, the OPL or resist material over the NFET device 24 and PFET device 26 can be removed. In embodiments, the removal process can include an ashing processing or other stripping processes. Also, the OPL or resist material over the NFET device 24 and PFET device 26 can be removed in the same removal process. As the OPL or resist material over the NFET device 24 and PFET device 26 have the same or substantially the same etching rate, the workfunction metal 20 and high-k dielectric material 18 over the PFET device 26 will not be over-etched during the OPL or resist removal. In this way, the ashing process can be more accurately controlled to avoid damage to the workfunction metal 20 over the PFET device 26 (or vice versa).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   removing a workfunction material over a first device area of a structure to expose an underlying dielectric material, while protecting the workfunction material over a second device area of the structure with a first masking material;
   applying a second masking material over the first device area directly on the underlying dielectric material and the first masking material over the second device area; and
   removing the first masking material and the second masking material until the workfunction material is exposed over the second device area,
   wherein the first masking material and the second masking material have a substantially same etching rate.

2. The method of claim 1, wherein the first masking material and the second masking material are optical planarization layers.

3. The method of claim 2, wherein the first device area is an NFET device area and the second device area is a PFET device area.

4. The method of claim 2, wherein the first device area is a PFET device area and the second device area is an NFET device area.

5. The method of claim 1, wherein the workfunction metal is formed within a trench over the first device area and within a trench of the second device area of the structure and the second masking material fills the trench in the first device area where the workfunction material was removed.

6. The method of claim 5, wherein the second masking material is deposited over a high-k dielectric material in the first device area.

7. The method of claim 1, wherein the second masking material will balance strip time of the first device area and the second device area.

8. The method of claim 1, wherein the second masking material has a different carbon percentage than the first masking material.

9. The method of claim 1, wherein the first masking material and the second masking material are removed in a same removal process.

10. A method comprising:
    forming a workfunction metal directly on a dielectric material within a trench on a first device area and a second device area;
    forming a masking material over the first device area;
    removing the workfunction material over the second device area to expose the dielectric material within the trench, while the workfunction material over first device area is protected with the masking material;
    applying a second masking material over the second device area including directly on the dielectric material within the trench and over the first masking material, the first masking material and the second masking material having a same or substantially the same removal rate; and
    removing the first masking material and the second masking material until the workfunction material is exposed over the first device area and the dielectric material is exposed over the second device area,
    wherein the second masking material balances strip time of the first device area and the second device area.

11. The method of claim 10, wherein the first masking material and the second masking material are optical planarization layers.

12. The method of claim 10, wherein the first device area is a FFET device area and the second device area is an NFET device area.

13. The method of claim 10, wherein the second masking material fills the trench in the second device area and is deposited over a high-k dielectric material in the first device area.

14. The method of claim 10, wherein the second masking material has a different carbon percentage than the first masking material.

15. The method of claim 10, wherein the first masking material and the second masking material are removed in a same removal process.

16. A method comprising:
    forming a workfunction metal directly on a high-k dielectric material in an NFET device area and a PFET device area;
    forming an optical planarization layer (OPL) over the PFET device area directly on the workfunction metal on the NFET device area and the PFET device area;
    removing the workfunction material to expose the high-k dielectric material in the NFET device area, while the workfunction material over PFET device area remains protected;
    applying a second layer of OPL over the NFET device area including within a trench having a lining of the high-k dielectric material and over the OPL; and
    removing the OPL and second OPL until the workfunction material is exposed over the PFET device area.

17. The method of claim 16, wherein the second OPL balances strip time of the PFET device area and the NFET device area.

18. The method of claim 16, wherein the second OPL has a different carbon percentage than the OPL.

19. The method of claim 16, wherein the OPL and the second OPL are removed in a same removal process.

* * * * *